(12) United States Patent
Leung et al.

(10) Patent No.: US 8,324,089 B2
(45) Date of Patent: Dec. 4, 2012

(54) COMPOSITIONS FOR FORMING DOPED REGIONS IN SEMICONDUCTOR SUBSTRATES, METHODS FOR FABRICATING SUCH COMPOSITIONS, AND METHODS FOR FORMING DOPED REGIONS USING SUCH COMPOSITIONS

(75) Inventors: Roger Yu-Kwan Leung, San Jose, CA (US); Wenya Fan, Campbell, CA (US); Jan Nedbal, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 314 days.

(21) Appl. No.: 12/839,924

(22) Filed: Jul. 20, 2010

(65) Prior Publication Data
US 2011/0021012 A1 Jan. 27, 2011

Related U.S. Application Data

(60) Provisional application No. 61/227,884, filed on Jul. 23, 2009.

(51) Int. Cl.
*H01L 21/385* (2006.01)
(52) U.S. Cl. ........... 438/563; 257/E21.468; 252/194
(58) Field of Classification Search ........... 257/E21.468
See application file for complete search history.

(56) References Cited

U.S. PATENT DOCUMENTS

| | | |
|---|---|---|
| 3,258,434 A | 2/1966 | Mackenzie et al. |
| 3,725,149 A | 4/1973 | Ilegems et al. |
| 3,877,956 A | 4/1975 | Nitzche et al. |
| 3,960,605 A | 6/1976 | Beck et al. |
| 4,030,938 A | 6/1977 | Thomas |
| 4,072,636 A | 2/1978 | Ashida et al. |
| 4,102,766 A | 7/1978 | Fey |
| 4,104,091 A | 8/1978 | Evans, Jr. et al. |
| 4,236,948 A | 12/1980 | Seibold et al. |
| 4,392,180 A | 7/1983 | Nair |
| 4,478,879 A | 10/1984 | Baraona et al. |
| 4,517,403 A | 5/1985 | Morel et al. |
| 4,548,741 A | 10/1985 | Hormadaly |

(Continued)

FOREIGN PATENT DOCUMENTS

CN 101369612 2/2009

(Continued)

OTHER PUBLICATIONS

Wang, C., et al., Photophysical Properties of Rare Earth (Eu3+, Sm3+, Tb3+) Complex Covalently Immobilized in Hybrid Si-O-B Xerogels, Journal of Fluorescence, 2011, pp. 1-9.

(Continued)

*Primary Examiner* — Stephen W Smoot
(74) *Attorney, Agent, or Firm* — Ingrassia Fisher & Lorenz, P.C.

(57) ABSTRACT

Compositions for forming doped regions in semiconductor substrates, methods for fabricating such compositions, and methods for forming doped regions using such compositions are provided. In one embodiment, a dopant-comprising composition comprises a conductivity-determining type impurity dopant, a silicate carrier, a solvent, and a moisture adsorption-minimizing component. In another embodiment, a dopant-comprising composition comprises a conductivity-determining type impurity dopant, a silicate carrier, a solvent, and a high boiling point material selected from the group consisting of glycol ethers, alcohols, and combinations thereof. The high boiling point material has a boiling point of at least about 150° C.

15 Claims, 6 Drawing Sheets

U.S. PATENT DOCUMENTS

| | | | |
|---|---|---|---|
| 4,571,366 A * | 2/1986 | Thomas et al. ............... 428/446 |
| 4,578,283 A | 3/1986 | Kirtley et al. |
| 4,707,346 A | 11/1987 | Hormadaly |
| 4,793,862 A | 12/1988 | Ishikawa et al. |
| 4,891,331 A | 1/1990 | Rapp |
| 4,927,770 A | 5/1990 | Swanson |
| 5,053,083 A | 10/1991 | Sinton |
| 5,152,819 A | 10/1992 | Blackwell et al. |
| 5,302,198 A | 4/1994 | Allman |
| 5,399,185 A | 3/1995 | Berthold et al. |
| 5,464,564 A | 11/1995 | Brown |
| 5,472,488 A | 12/1995 | Allman |
| 5,510,271 A | 4/1996 | Rohatgi et al. |
| 5,527,389 A | 6/1996 | Rosenblum |
| 5,527,872 A | 6/1996 | Allman |
| 5,591,565 A | 1/1997 | Holdermann et al. |
| 5,614,018 A | 3/1997 | Azuma et al. |
| 5,641,362 A | 6/1997 | Meier |
| 5,661,041 A | 8/1997 | Kano |
| 5,665,845 A | 9/1997 | Allman |
| 5,667,597 A | 9/1997 | Ishihara |
| 5,695,809 A | 12/1997 | Chadha et al. |
| 5,766,964 A | 6/1998 | Rohatgi et al. |
| 5,899,704 A | 5/1999 | Schlosser et al. |
| 5,928,438 A | 7/1999 | Salami et al. |
| 6,091,021 A | 7/2000 | Ruby et al. |
| 6,096,968 A | 8/2000 | Schlosser et al. |
| 6,099,647 A | 8/2000 | Yieh et al. |
| 6,143,976 A | 11/2000 | Endros |
| 6,162,658 A | 12/2000 | Green et al. |
| 6,180,869 B1 | 1/2001 | Meier et al. |
| 6,200,680 B1 | 3/2001 | Takeda et al. |
| 6,221,719 B1 | 4/2001 | Franco |
| 6,232,207 B1 | 5/2001 | Schindler |
| 6,251,756 B1 | 6/2001 | Horzel et al. |
| 6,262,359 B1 | 7/2001 | Meier et al. |
| 6,297,134 B1 | 10/2001 | Ui et al. |
| 6,300,267 B1 | 10/2001 | Chen et al. |
| 6,309,060 B1 | 10/2001 | Timmermans-Wang et al. |
| 6,355,581 B1 | 3/2002 | Vassiliev et al. |
| 6,429,037 B1 | 8/2002 | Wenham et al. |
| 6,479,885 B2 | 11/2002 | Buchanan et al. |
| 6,518,087 B1 | 2/2003 | Furusawa et al. |
| 6,552,414 B1 | 4/2003 | Horzel et al. |
| 6,632,730 B1 | 10/2003 | Meier et al. |
| 6,664,631 B2 | 12/2003 | Meier et al. |
| 6,695,903 B1 | 2/2004 | Kubelbeck et al. |
| 6,703,295 B2 | 3/2004 | Meier et al. |
| 6,737,340 B2 | 5/2004 | Meier et al. |
| 6,756,290 B1 | 6/2004 | Bultman |
| 6,773,994 B2 | 8/2004 | Chittipeddi et al. |
| 6,784,520 B2 | 8/2004 | Doi |
| 6,825,104 B2 | 11/2004 | Horzel et al. |
| 6,960,546 B2 | 11/2005 | Caspers et al. |
| 6,998,288 B1 | 2/2006 | Smith et al. |
| 7,029,943 B2 | 4/2006 | Kruhler |
| 7,041,549 B2 | 5/2006 | Ootsuka |
| 7,078,276 B1 | 7/2006 | Zurcher et al. |
| 7,078,324 B2 | 7/2006 | Dudek et al. |
| 7,097,788 B2 | 8/2006 | Kirkor et al. |
| 7,108,733 B2 | 9/2006 | Enokido |
| 7,115,216 B2 | 10/2006 | Carter et al. |
| 7,129,109 B2 | 10/2006 | Munzer et al. |
| 7,135,350 B1 | 11/2006 | Smith et al. |
| 7,144,751 B2 | 12/2006 | Gee et al. |
| 7,170,001 B2 | 1/2007 | Gee et al. |
| 7,186,358 B2 | 3/2007 | McCulloch et al. |
| 7,196,018 B2 | 3/2007 | Szlufcik et al. |
| 7,217,883 B2 | 5/2007 | Munzer |
| 7,278,728 B2 | 10/2007 | Desie et al. |
| 7,332,445 B2 | 2/2008 | Lukas et al. |
| 7,335,555 B2 | 2/2008 | Gee et al. |
| 7,393,464 B2 | 7/2008 | Wenderoth et al. |
| 7,393,723 B2 | 7/2008 | Yamazaki et al. |
| 7,402,448 B2 | 7/2008 | Narayanan et al. |
| 7,456,084 B2 | 11/2008 | Jonczyk et al. |
| 7,459,391 B2 | 12/2008 | Yoshizawa et al. |
| 7,468,485 B1 | 12/2008 | Swanson |
| 7,537,951 B2 | 5/2009 | Gambino et al. |
| 7,559,494 B1 | 7/2009 | Yadav et al. |
| 7,572,740 B2 | 8/2009 | Terry et al. |
| 7,615,393 B1 | 11/2009 | Shah et al. |
| 7,633,006 B1 | 12/2009 | Swanson |
| 7,635,600 B2 | 12/2009 | Zhang et al. |
| 7,638,438 B2 | 12/2009 | Eldershaw |
| 7,867,960 B2 | 1/2011 | Yamaguchi et al. |
| 8,053,867 B2 | 11/2011 | Huang et al. |
| 2002/0046765 A1 | 4/2002 | Uematsu et al. |
| 2002/0153039 A1 | 10/2002 | Moon et al. |
| 2003/0134469 A1 | 7/2003 | Horzel et al. |
| 2003/0153141 A1 | 8/2003 | Carter et al. |
| 2004/0028971 A1 | 2/2004 | Wenderoth et al. |
| 2004/0063326 A1 | 4/2004 | Szlufcik et al. |
| 2004/0112426 A1 | 6/2004 | Hagino |
| 2004/0242019 A1 | 12/2004 | Klein et al. |
| 2004/0261839 A1 | 12/2004 | Gee et al. |
| 2004/0261840 A1 | 12/2004 | Schmit et al. |
| 2005/0014359 A1 | 1/2005 | Segawa et al. |
| 2005/0189015 A1 | 9/2005 | Rohatgi et al. |
| 2005/0190245 A1 | 9/2005 | Desie et al. |
| 2005/0268963 A1 | 12/2005 | Jordan et al. |
| 2006/0060238 A1 | 3/2006 | Hacke et al. |
| 2006/0105581 A1 | 5/2006 | Bielefeld et al. |
| 2006/0162766 A1 | 7/2006 | Gee et al. |
| 2006/0163744 A1 | 7/2006 | Vanheusden et al. |
| 2006/0166429 A1 | 7/2006 | Chaudhry et al. |
| 2006/0222869 A1 | 10/2006 | Cai et al. |
| 2006/0237719 A1 | 10/2006 | Colfer et al. |
| 2006/0258820 A1 | 11/2006 | Schneider |
| 2007/0012355 A1 | 1/2007 | LoCascio et al. |
| 2007/0034251 A1 | 2/2007 | Jonczyk et al. |
| 2007/0075416 A1 | 4/2007 | Anderson et al. |
| 2007/0151598 A1 | 7/2007 | De Ceuster et al. |
| 2007/0157965 A1 | 7/2007 | Park |
| 2007/0215203 A1 | 9/2007 | Ishikawa et al. |
| 2007/0269923 A1 | 11/2007 | Lee et al. |
| 2007/0290283 A1 | 12/2007 | Park et al. |
| 2008/0024752 A1 | 1/2008 | Ng et al. |
| 2008/0026550 A1 | 1/2008 | Werner et al. |
| 2008/0036799 A1 | 2/2008 | Ittel |
| 2008/0042212 A1 | 2/2008 | Kamath et al. |
| 2008/0044964 A1 | 2/2008 | Kamath et al. |
| 2008/0048240 A1 | 2/2008 | Kamath et al. |
| 2008/0058231 A1 | 3/2008 | Yamaguchi et al. |
| 2008/0058232 A1 | 3/2008 | Yamaguchi et al. |
| 2008/0064813 A1 | 3/2008 | Schneider |
| 2008/0076240 A1 | 3/2008 | Veschetti et al. |
| 2008/0092944 A1 | 4/2008 | Rubin |
| 2008/0107814 A1 | 5/2008 | Wierer et al. |
| 2008/0107815 A1 | 5/2008 | Schneider et al. |
| 2008/0119593 A1 | 5/2008 | Stramel et al. |
| 2008/0121279 A1 | 5/2008 | Swanson |
| 2008/0138456 A1 | 6/2008 | Fork et al. |
| 2008/0142075 A1 | 6/2008 | Reddy et al. |
| 2008/0160733 A1 | 7/2008 | Hieslmair et al. |
| 2008/0199687 A1 | 8/2008 | Chiruvolu et al. |
| 2008/0202576 A1 | 8/2008 | Hiesimair |
| 2008/0210298 A1 | 9/2008 | Kuebelbeck et al. |
| 2008/0241986 A1 | 10/2008 | Rohatgi et al. |
| 2008/0241987 A1 | 10/2008 | Rohatgi et al. |
| 2008/0241988 A1 | 10/2008 | Rohatgi et al. |
| 2008/0251121 A1 | 10/2008 | Stone |
| 2008/0264332 A1 | 10/2008 | Sepehry-Fard |
| 2008/0268584 A1 | 10/2008 | Anderson et al. |
| 2008/0290368 A1 | 11/2008 | Rubin |
| 2008/0314288 A1 | 12/2008 | Biro et al. |
| 2009/0007962 A1 | 1/2009 | Wenham et al. |
| 2009/0007965 A1 | 1/2009 | Rohatgi et al. |
| 2009/0017606 A1 | 1/2009 | Fath et al. |
| 2009/0020156 A1 | 1/2009 | Ohtsuka et al. |
| 2009/0020829 A1 | 1/2009 | Chandra et al. |
| 2009/0068474 A1 | 3/2009 | Lower et al. |
| 2009/0068783 A1 | 3/2009 | Borden |
| 2009/0084440 A1 | 4/2009 | Wang et al. |
| 2009/0142565 A1 | 6/2009 | Takahashi et al. |
| 2009/0142875 A1 | 6/2009 | Borden et al. |
| 2009/0142911 A1 | 6/2009 | Asano et al. |

| | | | |
|---|---|---|---|
| 2009/0149554 | A1 | 6/2009 | Ishikawa et al. |
| 2009/0183768 | A1 | 7/2009 | Wenham et al. |
| 2009/0194153 | A1 | 8/2009 | Hilaii et al. |
| 2009/0226609 | A1 | 9/2009 | Boisvert et al. |
| 2009/0227061 | A1 | 9/2009 | Bateman et al. |
| 2009/0227097 | A1 | 9/2009 | Bateman et al. |
| 2009/0233426 | A1 | 9/2009 | Poplavskyy et al. |
| 2009/0235980 | A1* | 9/2009 | Nishida .................... 136/256 |
| 2009/0239330 | A1 | 9/2009 | Vanheusden et al. |
| 2009/0239363 | A1 | 9/2009 | Leung et al. |
| 2009/0260684 | A1 | 10/2009 | You |
| 2009/0308440 | A1 | 12/2009 | Adibi et al. |
| 2009/0314341 | A1 | 12/2009 | Borden et al. |
| 2009/0314344 | A1 | 12/2009 | Fork et al. |
| 2010/0016200 | A1 | 1/2010 | Nagare et al. |
| 2010/0048006 | A1* | 2/2010 | Huang et al. .................. 438/542 |
| 2010/0068848 | A1 | 3/2010 | Kuo |
| 2010/0175744 | A1 | 7/2010 | Hirai et al. |
| 2010/0261347 | A1 | 10/2010 | Nobutoh |
| 2011/0021736 | A1 | 1/2011 | Zhu |
| 2011/0195541 | A1 | 8/2011 | Machii et al. |
| 2011/0256658 | A1 | 10/2011 | Machii et al. |

FOREIGN PATENT DOCUMENTS

| | | |
|---|---|---|
| CN | 102057466 A | 11/2011 |
| EP | 0195148 A1 | 9/1986 |
| EP | 0381430 A2 | 1/1990 |
| EP | 485122 | 5/1992 |
| EP | 0485122 A1 | 5/1992 |
| EP | 0890980 A2 | 1/1999 |
| EP | 1024523 A1 | 8/2000 |
| EP | 0770265 B1 | 3/2002 |
| EP | 1843389 A1 | 10/2007 |
| EP | 1876651 A1 | 1/2008 |
| GB | 1250585 | 12/1968 |
| JP | 09306853 | 11/1997 |
| JP | 2003188393 A | 4/2003 |
| JP | 2003168807 | 6/2003 |
| JP | 2003168807 A | 6/2003 |
| JP | 2003168810 | 6/2003 |
| JP | 2003224285 A | 8/2003 |
| JP | 2004221149 | 8/2004 |
| JP | 2005038997 | 2/2005 |
| JP | 2007081300 | 3/2007 |
| JP | 2003188393 | 7/2009 |
| JP | 2003224285 | 8/2009 |
| KR | 10-199-0066346 A1 | 8/1999 |
| WO | 9715075 | 4/1997 |
| WO | 2006029250 A2 | 3/2006 |
| WO | 2006131251 A1 | 12/2006 |
| WO | 2007059577 A1 | 5/2007 |
| WO | 2007059578 A1 | 5/2007 |
| WO | 2007106502 A2 | 9/2007 |
| WO | 2007111996 A2 | 10/2007 |
| WO | 2007118121 A2 | 10/2007 |
| WO | 20070111996 | 10/2007 |
| WO | 2007129966 | 11/2007 |
| WO | 2008039078 A2 | 4/2008 |
| WO | 2008054473 A2 | 5/2008 |
| WO | 2008085806 A1 | 7/2008 |
| WO | 2008098407 A1 | 8/2008 |
| WO | 2008141415 A1 | 11/2008 |
| WO | 2009010585 A2 | 1/2009 |
| WO | 2009013307 A2 | 1/2009 |
| WO | 2009032359 A2 | 3/2009 |
| WO | 2009052511 A2 | 4/2009 |
| WO | 2009067005 A1 | 5/2009 |
| WO | 2009085224 A2 | 7/2009 |
| WO | 2009088138 A1 | 7/2009 |
| WO | 2009094575 A2 | 7/2009 |
| WO | 2009107920 A1 | 9/2009 |
| WO | 2009116569 A1 | 9/2009 |
| WO | 2009126803 A2 | 10/2009 |
| WO | 2009152378 A1 | 12/2009 |
| WO | 2010089654 A1 | 8/2010 |

OTHER PUBLICATIONS

Smirnovam, I., et al., Investigation into the Surface Morphology of Nanosized Silicate and Hybrid Films by Optical and Atomic-Force Microscopy, Glass Physics and Chemistry, vol. 33, No. 4, 2007, pp. 306-314.

International Search Report and Written Opinion mailed May 24, 2012 in International Application No. PCT/CN2011/001392.

Diffusion Technology Phosphorus Spin-On Dpoants P-8 Series (P-8545, P-854 (2:1), Material Safety Data Sheet, Honeywell International, Apr. 25, 2003, p. 1-7.

Accuglass P-114A Spin-On Glass, Material Safety Data Sheet, Honeywell International, Oct. 29, 2003, pp. 1-6.

Accuglass P-XXX Spin-On Glass, Material Safety Data Sheet, Honeywell International, May 14, 2003, pp. 1-7.

B-30, B-40, B-50, B-60 Spin-On Dopants, Material Safety Data Sheet, Honeywell International, Apr. 29, 2003, pp. 1-7.

ACCUSPIN Boron; Polymers for All P-Type Diffusion, Honeywell International, 2005, pp. 1-2.

Spin-On Dopants, Thin Film-Dielectrics, Application Comparision, Honeywell International, 2002, pp. 1-2.

Accuglass P-5S, Product Bulletin, Thin-Film Dielectrics, Honeywell International, 2002, pp. 1-2.

Accuglass P-TTY Product Bulletin, Thin-Film Dielectrics, Honeywell International, 2002, pp. 1-2.

Accuglass P-TTY A Series Phosphosilicate Spin-On Glasses, Allied Signal, Inc. Planarization and Diffusion Products, May 1992, pp. 1-2.

Horzel, J. et al., A Simple Processing Sequence for Selective Emitters, 26th PVSC, Sep. 30-Oct. 3, 1997.

Tonooka, K, et al., Flourescent Properties of Tb-doped Borosilicate Glass films Prepared by a Sol-Gel Method, Proceedings of SPIE—The International Socieity for Optical Engineering, v 4282, p. 193-199, 2001.

Yun, Y., et al., Behavior of Various Organosillicon Molecules in PECVD Processes for Hydrocarbon-doped Silicon Oxide Films, Solid State, Phenomena, vols. 121-126, pp. 347,350, 2007.

Tajima, N., et al., Carbon-doped Silicon Oxide Films with Hydrocarbon Network Bonds for Low-k Dielectrics: T Japanese Journal of Applied Physics, v 46, n 9 A, p. 5970-5974, 2007.

Takeda S., et al, Surface Modification of Sputtered SiO2 Thin films by Metal Doping, Materials Research Society Symposium—Proceedings v 750, p. 443-448, 2002.

Sabbah, H. et al., Thermal Grafting of Fluorinated Molecular Monolayers on Doped Amorphous Silicon Surfaces, Journal of Applied Physics, v 705, n 8, 2009.

Osada, Y., et al., Plasrna-polymerized Organosiloxane Membranes Prepared by Simultaneous Doping of 12 Molecules and the Effect on Liquid Permeability, Journal of Polymer Science, v 23, n 9, p. 2425-2439, Sep. 1985.

Popuv,V, et al Atomically Flat Surface of Hydrogen Transferred Si Film with Boron Delta Doped Layer, Electrochemicial Society Proceedings, p. 346-354, May 2005.

Li , J,. et al., A Pre-Modification-Direct Synthesis Route for the Covalent Incorporation and Monomeric Dispersion of Hydrophobic Organic Chromophores in Mesoporous Silica Films, Science Direct, Microporous and Mesoporous Material, 111 p. 150-156 2008.

A simple processing sequence for selective emitters [Si solarcells]; Horzel, J., Szlufcik, J., Nijs J., Mertens, R, Imec, Heverlee; Photovoltaic Specialists Conference, 1997., Conference Record of the Twenty-Sixth IEEE; Sep. 29-Oct. 3, 1997; pp. 139-142; Meeting Date: Sep. 29, 1997-Oct. 3, 1997; Location: Anaheim, CA USA.

BoronPlus, High PLO Planar Dopants, ISO Certified 3002/14001, Techneglas Technical Products, 2000.

Techniglas Technical Products, Boron Plus, Product Information, pp. 1-3.

Zable, J.L., Splatter During Ink Jet Printing, IBM J. Res. Develop., Jul. 1977, pp. 315-320.

\* cited by examiner

COMPOSITIONS FOR FORMING DOPED REGIONS IN SEMICONDUCTOR SUBSTRATES, METHODS FOR FABRICATING SUCH COMPOSITIONS, AND METHODS FOR FORMING DOPED REGIONS USING SUCH COMPOSITIONS

RELATED APPLICATIONS

This application claims priority to U.S. Patent Provisional Appl. No. 61/227,884 filed Jul. 23, 2009, which is incorporated herein in its entirety.

FIELD OF THE INVENTION

The present invention generally relates to compositions for forming doped regions in semiconductor substrates, methods for fabricating such compositions, and methods for forming doped regions using such compositions, and more particularly relates to compositions that are moisture resistant and/or that form conformal coatings for forming doped regions in semiconductor substrates, methods for fabricating such compositions, and methods for forming doped regions using such compositions.

BACKGROUND OF THE INVENTION

Conductivity-determining type impurity dopant-comprising compositions, such as borosilicates and phosphosilicates, are used extensively for doping semiconductor substrates, such as to form pn junctions and contact areas. In some applications, the doped silicates are designed to perform other functions such as to serve as barrier regions, insulation regions, etc. Typically, the doped silicates are coated on the semiconductor substrates and then are thermally treated, such as by rapid thermal annealing, to cause the dopants to diffuse into the substrates. These applications typically require defect-free and thicker precursor coatings on the substrates.

However, it is difficult to achieve defect-free and thicker precursor coatings with conventional doped silicates, particularly on semiconductor wafers used in applications, such as solar cells, that have a rougher topology than semiconductor wafers used for semiconductor devices. When applied to a semiconductor wafer, which typically has a surface topology with peaks and valleys, a conventional precursor coating tends to be thin on the peaks and accumulate in the valleys. This nonuniformity in thickness causes the coating to crack, leading to doping anomalies. Accordingly, there is a need for dopant-comprising compositions that form conformal precursor coatings to minimize cracking.

In addition, precursor coatings formed from prior art doped silicates, such as conventional sol-gel doped silicates, tend to adsorb moisture over time. Adsorption of water in the precursor coating leads to particle defects and phase separation in the coating. Accordingly, there is a need for moisture resistant dopant-comprising compositions that provide suitable doping concentrations while resisting moisture adsorption.

Thus, it is desirable to provide moisture-resistant conductivity-determining type impurity dopant-comprising compositions for forming doped regions in semiconductor substrates. In addition, it is desirable to provide conductivity-determining type impurity dopant-comprising compositions that form conformal precursor coatings on semiconductor substrates. It also is desirable to provide methods for fabricating such compositions. Moreover, it is desirable to provide methods for forming doped regions using such compositions. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

Compositions for forming doped regions in semiconductor substrates, methods for fabricating such compositions, and methods for forming doped regions using such compositions are provided. In accordance with an exemplary embodiment, a dopant-comprising composition comprises a conductivity-determining type impurity dopant, a silicate carrier, a solvent, and a moisture adsorption-minimizing component.

In accordance with another embodiment, a dopant-comprising composition comprises a conductivity-determining type impurity dopant, a silicate carrier, a solvent, and a high boiling point material selected from the group consisting of glycol ethers, alcohols, esters, alkanes, acids, and combinations thereof. The high boiling point material has a boiling point of at least about 150° C.

In accordance with an exemplary embodiment, a method for forming a doped region in a semiconductor substrate is provided. The method comprises applying a dopant-comprising composition to a region of the semiconductor substrate, wherein the dopant-comprising composition comprises a conductivity-determining type impurity dopant, a silicate carrier, a solvent, and a moisture adsorption-minimizing component. The semiconductor substrate is subjected to a thermal treatment such that the conductivity-determining type impurity dopant diffuses into the semiconductor substrate.

In accordance with another exemplary embodiment, a method for forming a doped region in a semiconductor substrate is provided. The method comprises applying a dopant-comprising composition to a region of the semiconductor substrate. The dopant-comprising composition comprises a conductivity-determining type impurity dopant, a silicate carrier, a solvent, and a high boiling point material selected from the group consisting of glycol ethers, alcohols, esters, alkanes, acids, and combinations thereof. The high boiling point material has a boiling point of at least about 150° C. The semiconductor substrate is subjected to a thermal treatment such that the conductivity-determining type impurity dopant diffuses into the semiconductor substrate.

In accordance with an exemplary embodiment, a method for forming a dopant-comprising composition comprises combining a dopant contributor with a silicate carrier to form a dopant-silicate carrier, and adding a moisture adsorption-minimizing component to the silicate carrier, the dopant-silicate carrier, or both.

In another exemplary embodiment, a method for forming a dopant-comprising composition comprises combining a dopant contributor with a silicate carrier to form a dopant-silicate carrier, and adding to the silicate carrier, the dopant-silicate carrier, or both a high boiling point material selected from the group consisting of glycol ethers, alcohols, esters, alkanes, acids, and combinations thereof. The high boiling point material has a boiling point of at least about 150° C.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Conductivity-determining type impurity dopant-comprising compositions (hereinafter "dopant-comprising compositions" or simply "compositions") that resist moisture and/or form conformal precursor coatings on semiconductor substrates, methods for fabricating such compositions, and methods for forming doped regions in semiconductor substrates using such compositions are provided. In one exemplary embodiment, the compositions contemplated herein comprise a moisture adsorption-minimizing component that causes the composition to resist moisture absorption. In this regard, in addition to decreasing moisture adsorption, the moisture-adsorption-minimizing component slightly increases the pH of the composition, making the composition less corrosive and extending its shelf-life. Alternatively, or in addition, the compositions contemplated herein comprise a glycol ether, alcohol, or a combination thereof that causes the composition to form a conformal precursor coating, that is, a precursor coating having a substantially uniform thickness across the surface of a semiconductor substrate upon which the coating lies. A conformal coating is less susceptible to cracking than a non-conformal coating and is thus more conducive to desired dopant profiles after heat treatment. In this regard, the glycol ether and/or the alcohol have a boiling point of at least 150° C. In a preferred embodiment, the glycol ether and/or the alcohol has a boiling point of greater than 150° C.

Figure 1:
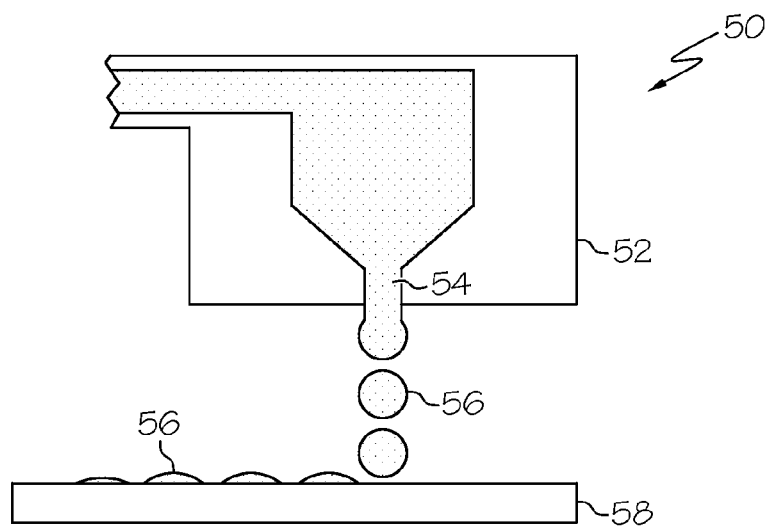
FIG. 1 is a cross-sectional view of an inkjet printer mechanism distributing ink on a substrate.
Figure 2:
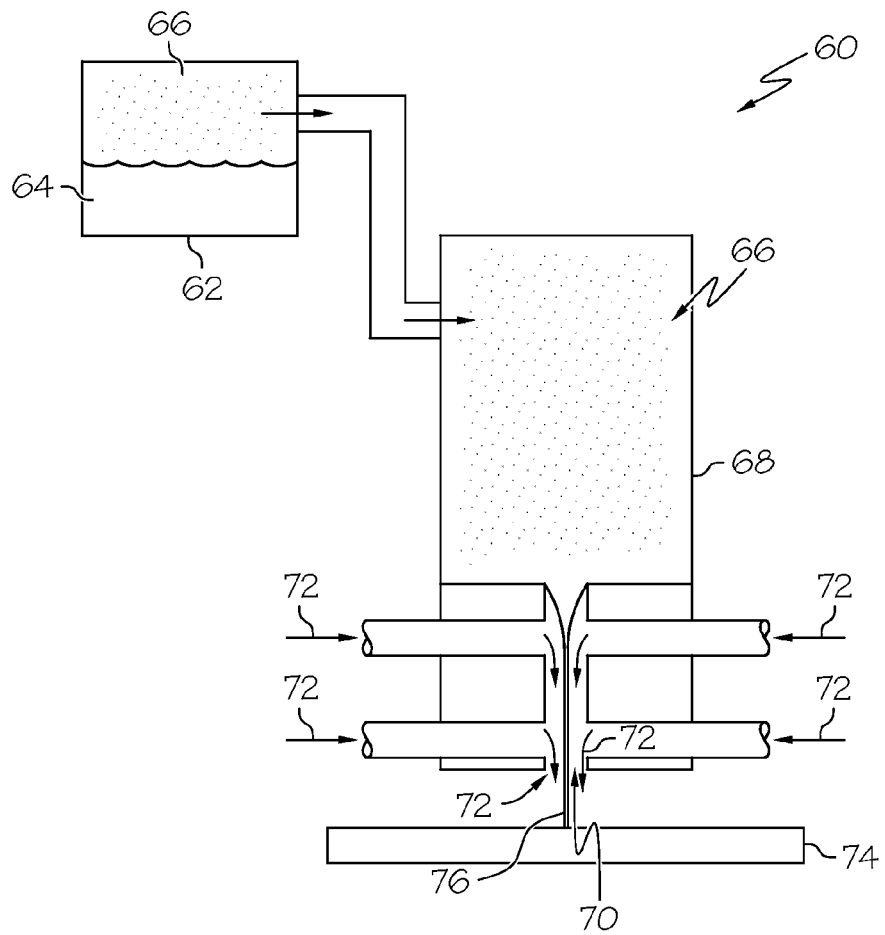
FIG. 2 is a cross-sectional view of an aerosol jet printer mechanism distributing ink on a substrate.

The various exemplary embodiments of the compositions contemplated herein are formulated for doping semiconductor substrates using application processes that include both non-contact printing processes and contact printing processes. As used herein, the term "non-contact printing process" means a process for depositing a liquid conductivity-determining type impurity dopant-comprising composition selectively on a semiconductor material in a predetermined patterned without the use of a mask, screen, or other such device. Examples of non-contact printing processes include, but are not limited to, "inkjet printing" and "aerosol jet printing." Typically, the terms "inkjet printing," an "inkjet printing process," "aerosol jet printing," and an "aerosol jet printing process" refer to a non-contact printing process whereby a liquid is projected from a nozzle directly onto a substrate to form a desired pattern. In an inkjet printing mechanism 50 of an inkjet printer, as illustrated in FIG. 1, a print head 52 has several tiny nozzles 54, also called jets. As a substrate 58 moves past the print head 52, or as the print head 52 moves past the substrate, the nozzles spray or "jet" ink 56 onto the substrate in tiny drops, forming images of a desired pattern. In an aerosol jet printing mechanism 60, illustrated in FIG. 2, a mist generator or nebulizer 62 atomizes a liquid 64. The atomized fluid 66 is aerodynamically focused using a flow guidance deposition head 68, which creates an annular flow of sheath gas, indicated by arrow 72, to collimate the atomized fluid 66. The co-axial flow exits the flow guidance head 68 through a nozzle 70 directed at the substrate 74 and focuses a stream 76 of the atomized material to as small as a tenth of the size of the nozzle orifice (typically 100 microns (μm)). Patterning is accomplished by attaching the substrate to a computer-controlled platen, or by translating the flow guidance head while the substrate position remains fixed.

Such non-contact printing processes are particularly attractive processes for fabricating doped regions in semiconductor materials for a variety of reasons. First, unlike screen printing or photolithography, only a dopant that is used to form the doped regions touches or contacts the surface of the semiconductor material upon which the dopant is applied. Thus, because the breaking of semiconductor materials could be minimized compared to other known processes, non-contact processes are suitable for a variety of semiconductor materials, including rigid and flexible semiconductor materials. In addition, such non-contact processes are additive processes, meaning that the dopant is applied to the semiconductor materials in the desired pattern. Thus, steps for removing material after the printing process, such as is required in photolithography, are eliminated. Further, because such non-contact processes are additive processes, they are suitable for semiconductor materials having smooth, rough, or textured surfaces. Non-contact processes also permit the formation of very fine features on semiconductor materials. In one embodiment, features, such as, for example, lines, dots, rectangles, circles, or other geometric shapes, having at least one dimension of less than about 200μm can be formed. In another exemplary embodiment, features having at least one dimension of less than about 100μm can be formed. In a preferred embodiment, features having at least one dimension of less than about 20μm can be formed. In addition, because non-contact processes involve digital computer printers that can be programmed with a selected pattern to be formed on a semiconductor material or that can be provided the pattern from a host computer, no new masks or screens need to be produced when a change in the pattern is desired. All of the above reasons make non-contact printing processes cost-efficient processes for fabricating doped regions in semiconductor materials, allowing for increased throughput compared to screen printing and photolithography.

However, while non-contact printing processes are preferred methods for forming doped regions in a semiconductor material in accordance with certain exemplary embodiments of the present invention, the invention is not so limited and, in other exemplary embodiments, the doping compositions can be deposited using other application processes, such as screen printing and roller printing, that can achieve localized doping. Screen printing involves the use of a patterned screen or stencil that is disposed over a semiconductor material. Liquid dopant is placed on top of the screen and is forced through the screen to deposit on the semiconductor material in a pattern that corresponds to the pattern of the screen. Roller printing involves a roller upon which is engraved a pattern. A liquid dopant is applied to the engraved pattern of the roller, which is pressed against a semiconductor material and rolled across the semiconductor material, thereby transferring the liquid dopant to the semiconductor material according to the pattern on the roller.

Figure 3:
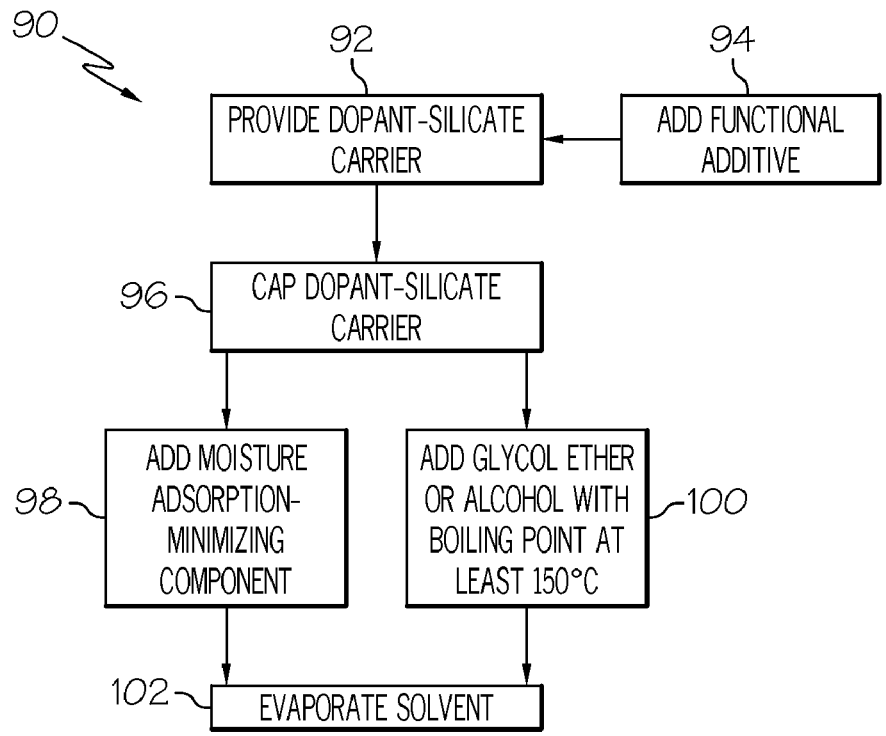
FIG. 3 is a flowchart of a method for formulating a dopant-comprising composition, in accordance with an exemplary embodiment of the present invention.
Figure 4:
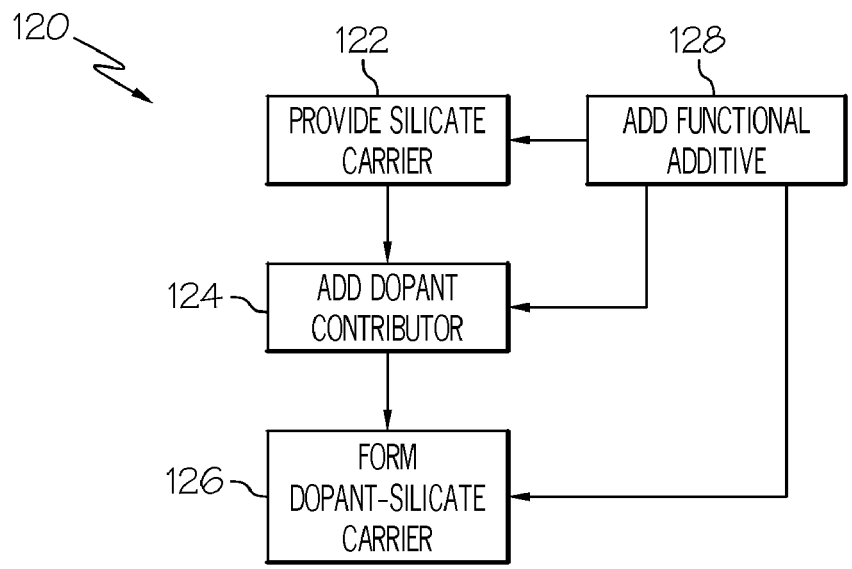
FIG. 4 is a flowchart of a method for formulating a dopant-silicate carrier for use in the dopant-comprising composition of FIG. 3, in accordance with an exemplary embodiment of the present invention.

Referring to FIG. 3, in accordance with one exemplary embodiment of the present invention, a method 90 for fabricating a dopant-comprising composition contemplated herein includes the step of providing a dopant-silicate carrier (step 92). In one exemplary embodiment, a method 120 for making a dopant-silicate carrier is illustrated in FIG. 4. The method begins by providing a silicate carrier (step 122). As described in more detail below, the silicate carrier will serve as the carrier of the impurity dopant of the composition. The terms "silicate" and "silicate carrier" are used herein to encompass silicon- and oxygen-containing compounds including, but not limited to, silicates, including organosilicates, siloxanes, silsesquioxanes, and the like. In one exemplary embodiment, suitable silicate carriers include commercially available silicate carriers such as, for example, USG-50, 103AS, 203AS, T30 and T111, all available from Honeywell International of Morristown, N.J. In another exemplary embodiment, a silicate carrier may be formed by combining at least one hydrolysable silane with at least one hydrogen ion contributor to undergo hydrolysis and polycondensation in a sol-gel reaction to form the silicate carrier. Preferably, the hydrolysable silane, or mixture of hydrolysable silanes, is selected so that the carbon content of the resulting dopant-silicate carrier, with or without end-capping, as discussed in more detail below, is in the range of 0 to about 25 weight percent (wt. %). A carbon content in this range is sufficiently high that it may improve shelf-life of the dopant-comprising composition and minimize nozzle clogging but is sufficiently low so as not to inhibit deglazing of the composition from the substrate after anneal. Suitable hydrolysable silanes include those having the formula $R^1{}_m SiR^2{}_n$, where $R^1$ is hydrogen or an alkyl or aryl group, $R^2$ is an alkoxy, acetoxy, or chloro group, n is a number between 1 and 4, and m=4−n. Examples of hydrolysable silanes suitable for use in forming the silicate carrier include, but are not limited to, chlorosilane, methylchlorosilane, tetralkoxysilanes such as, for example, tetraethylorthosilicate (TEOS), tetramethoxysilane, and tetraacetoxysilane, alkyltrialkoxysilanes such as, for example, methyltrimethoxysilane, dialkyldialkoxysilanes such as dimethyldimethoxysilane, and the like, and combinations thereof. Examples of hydrogen ion contributors include water, preferably de-ionized water, and methanol. The sol-gel reaction is catalyzed by the addition of either an acid or base, such as, for example, nitric acid, acetic acid, ammonium hydroxide, and the like.

In one exemplary embodiment, the silicate carrier is formed in a solvent in which the silicate sol-gel is soluble. The presence of a solvent during formation of the silicate carrier allows for slowing and/or controlling of the polymerization of the sol-gel. Solvents suitable for use comprise any suitable pure fluid or mixture of fluids that is capable of forming a solution with the silicate sol-gel and that may be volatilized at a desired temperature. In some contemplated embodiments, the solvent or solvent mixture comprises aliphatic, cyclic, and aromatic hydrocarbons. Aliphatic hydrocarbon solvents may comprise both straight-chain compounds and compounds that are branched. Cyclic hydrocarbon solvents are those solvents that comprise at least three carbon atoms oriented in a ring structure with properties similar to aliphatic hydrocarbon solvents. Aromatic hydrocarbon solvents are those solvents that comprise generally benzene or naphthalene structures. Contemplated hydrocarbon solvents include toluene, xylene, p-xylene, m-xylene, mesitylene, solvent naphtha H, solvent naphtha A, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosene, isobutylbenzene, methylnaphthalene, ethyltoluene, and ligroine.

In other contemplated embodiments, the solvent or solvent mixture may comprise those solvents that are not considered part of the hydrocarbon solvent family of compounds, such as alcohols, ketones (such as acetone, diethylketone, methylethylketone, and the like), esters, ethers, amides and amines Examples of solvents suitable for use during formation of the silicate carrier include alcohols, such as methanol, ethanol, propanol, butanol, and pentanol, anhydrides, such as acetic anhydride, and other solvents such as propylene glycol monoether acetate and ethyl lactate, and mixtures thereof.

The hydrolysable silane, the hydrogen ion contributor, and any present solvents are mixed using any suitable mixing or stirring process that forms a homogeneous sol-gel mixture. For example, a reflux condenser, a low speed sonicator or a high shear mixing apparatus, such as a homogenizer, a microfluidizer, a cowls blade high shear mixer, an automated media mill, or a ball mill, may be used for several seconds to an hour or more to form the silicate carrier. Heat also may be used to facilitate formation of the silicate carrier, although the heating should be undertaken at conditions that avoid substantial vaporization of the solvent(s), that is, at conditions that avoid evaporation of more than about 10 wt. % of the solvent. In a preferred embodiment of the present invention, the silicate carrier is formed at a temperature in the range of about 15° C. to about 160° C.

In an optional exemplary embodiment of the invention, a functional additive may be added to the silicate carrier (step 128), that is, during or after formation of the silicate carrier. In one exemplary embodiment, a spread-minimizing additive is added. The spread-minimizing additive is an additive that modifies the surface tension, viscosity, and/or wettability of the dopant-comprising composition so that spreading of the composition when penned onto the substrate is minimized Examples of spread-minimizing additives include, but are not limited to, iso-stearic acid, polypropylene oxide (PPO), such as polypropylene oxide having a molecular weight of 4000 (PPO4000), vinylmethylsiloxane-dimethylsiloxane copolymer, such as VDT131 available form Gelest, Inc. of Tullytown, Pa., polyether-modified polysiloxanes, such as Tegophren 5863 available from Evonik Degussa GmbH of Essen, Germany, other organo-modified polysiloxanes, such as Tegoglide 420 also available from Evonik Degussa GmbH, and the like, and combinations thereof.

In addition, it also is desirable to minimize the drying rate of the resulting composition to minimize or eliminate clogging of the printer nozzles, such as nozzles having dimensions as small as 10 nm. Thus, in another exemplary embodiment, a functional additive such as a solvent with a high boiling point, that is, in the range of from about 50° C. to about 250° C., such as, for example, glycerol, may be added to increase the boiling point of the resulting dopant-comprising composition and minimize the drying rate of the composition. In a preferred embodiment, the silicate sol-gel is soluble in the high boiling point solvent. Examples of solvents with high boiling points suitable for use include glycerol, propylene glycol, iso-stearic acid, propylene glycol butyl ether, ethylene glycol, and the like, and combinations thereof.

It also may be desirable to minimize the amount of the resulting dopant-comprising composition that diffuses beyond the penned area, that is, the area upon which the dopant-comprising composition is deposited during printing, into unpenned areas of the substrate before the predetermined annealing temperature of the annealing process is reached. As noted above, diffusion of the dopant-comprising composition beyond the penned area into unpenned areas before annealing can significantly affect the electrical characteristics of the resulting semiconductor device that utilizes the subsequently-formed doped region. Thus, in a further exemplary embodiment, a functional additive such as a viscosity modifier that minimizes or prevents such diffusion may be added. Preferably, the resulting dopant-comprising composition, described in more detail below, is soluble in the viscosity modifier. Examples of such viscosity-modifiers include glycerol, polyethylene glycol, polypropylene glycol, ethylene glycol/propylene glycol copolymer, organo-modified siloxanes, ethylene glycol/siloxane copolymers, polyelectrolyte, and the like, and combinations thereof. Examples of other suitable additives that may be added to the silicate carrier include dispersants, surfactants, polymerization inhibitors, wetting agents, antifoaming agents, detergents and other surface-tension modifiers, flame retardants, pigments, plasticizers, thickeners, viscosity modifiers, rheology modifiers, and mixtures thereof. It will be appreciated that a functional additive may serve one or more functions. For example, a spread-minimizing additive may also serve as a high-boiling point solvent, and/or a high boiling point solvent may serve as a viscosity modifier.

The method 100 further includes the step of adding a dopant contributor (step 124). The dopant contributor, as described in more detail below, is the source of the conductivity-determining type impurity dopants that will bond with or be dispersed within the silicate carrier, thus forming a dopant-silicate carrier. In one exemplary embodiment, the dopant contributor is added directly to the silicate carrier. Boron contributors suitable for use in method 120 include boric acid, boron oxide, boron tribromide, boron triiodide, triethylborate, tripropylborate, tributylborate, trimethylborate, tri(trimethylsilyl)borate, and the like, and combinations thereof. Suitable phosphorous contributors include phosphorous oxides, such as phosphorous pentoxide, phosphoric acid, phosphorous acid, phosphorus tribromide, phosphorus triiodide, and the like, and combinations thereof. In another exemplary embodiment, at least one dopant contributor is mixed with a solvent or mixture of solvents in which the dopant contributor is soluble before addition to the silicate carrier. Suitable solvents include any of the solvents described above for fabricating the silicate carrier. In an optional embodiment, functional additives, such as any of the functional additives described above, may be added to the dopant contributor and/or the solvent in addition to, or instead of, addition of the functional additive during or after formation of the silicate carrier (step 128). If used, the solvent and any functional additives can be mixed with the dopant contributor using any suitable mixing or stirring process described above. Heat also may be used to facilitate mixing, although the heating should be undertaken at conditions that avoid substantial vaporization of the solvent(s). In a preferred embodiment of the present invention, the dopant contributor is mixed with at least one solvent and/or functional additive at a temperature in the range of about 15° C. to about 180° C.

Figure 5:
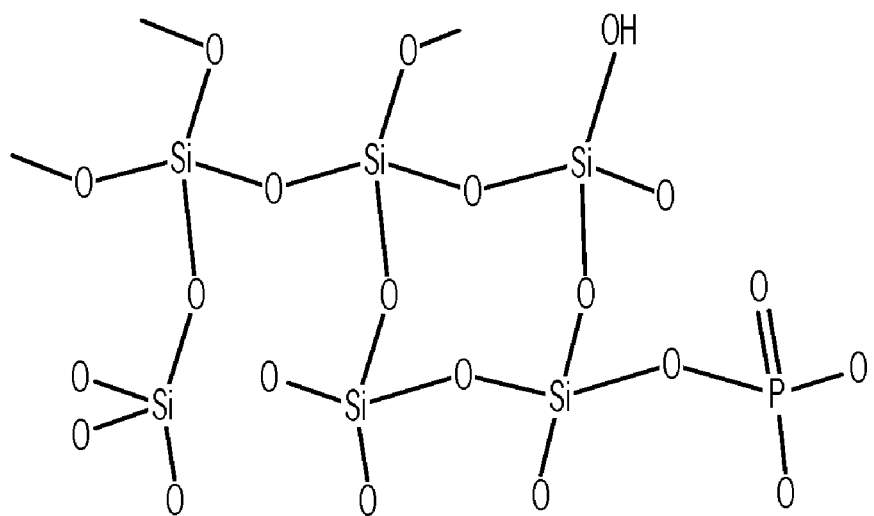
FIG. 5 is an illustration of a portion of a molecular structure of a phosphosilicate carrier formed using the method of FIG. 4.
Figure 6:
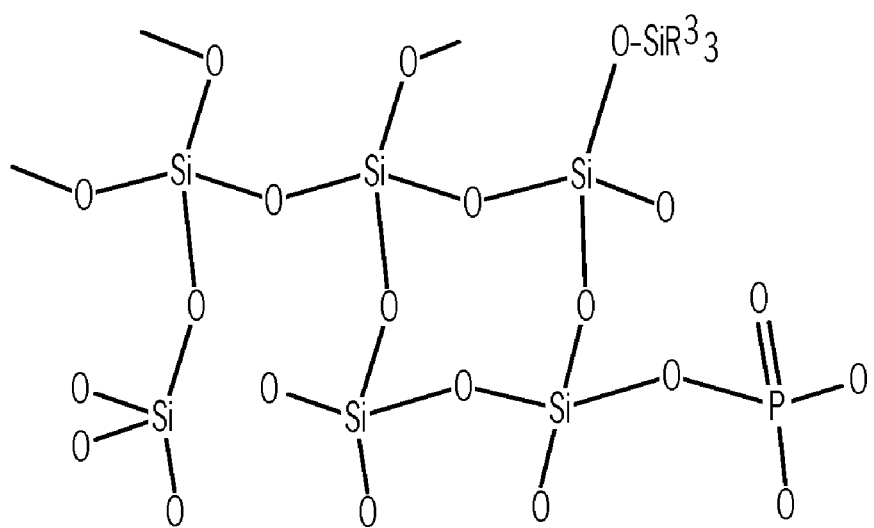
FIG. 6 is an illustration of a portion of a molecular structure of an end-capped phosphosilicate carrier formed using the method of FIG. 4.
Figure 7:
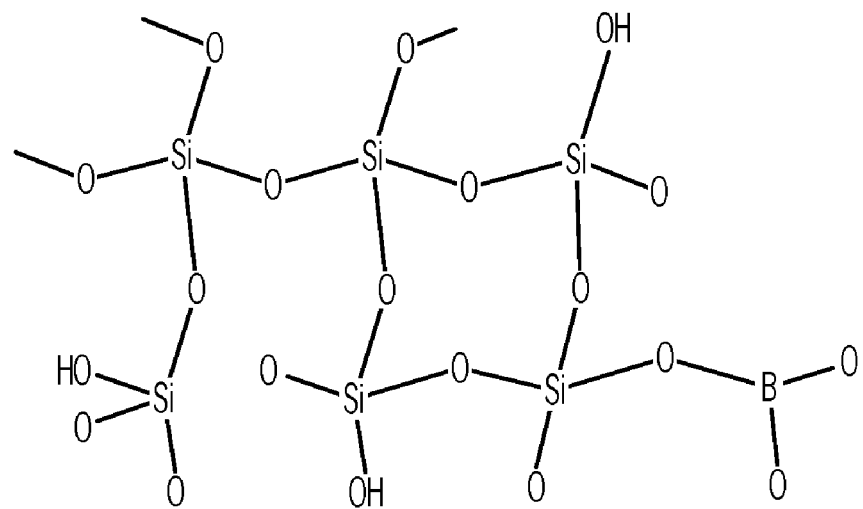
FIG. 7 is an illustration of a portion of a molecular structure of a borosilicate carrier formed using the method of FIG. 4.
Figure 8:
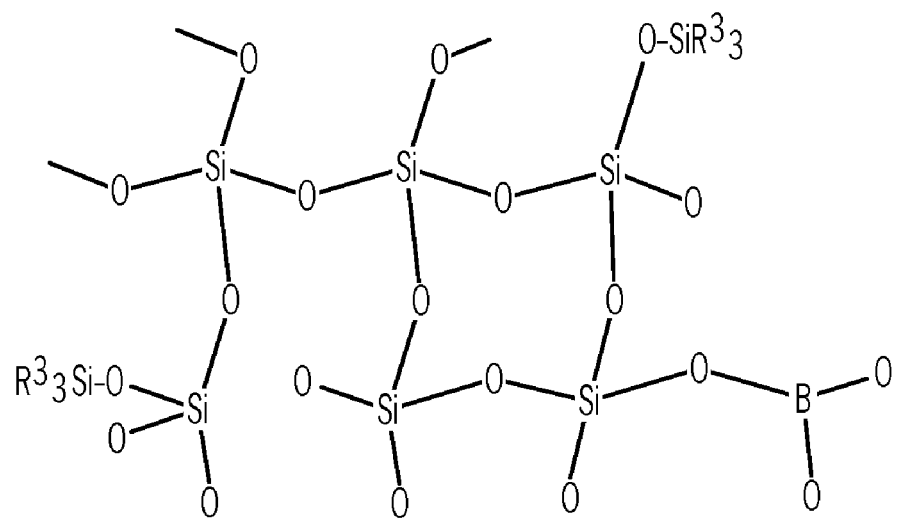
FIG. 8 is an illustration of a portion of a molecular structure of an end-capped borosilicate carrier formed using the method of FIG. 4.
Figure 9:
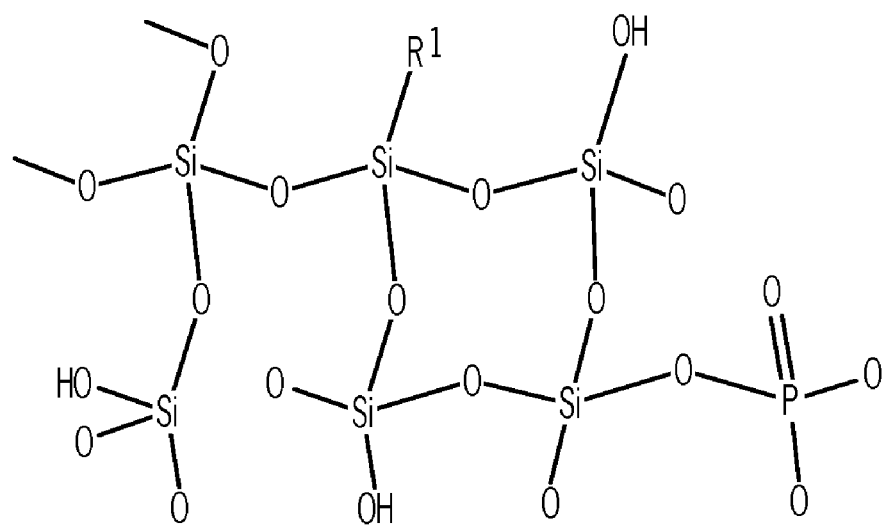
FIG. 9 is an illustration of a portion of a molecular structure of a phosphosiloxane carrier formed using the method of FIG. 4.
Figure 10:
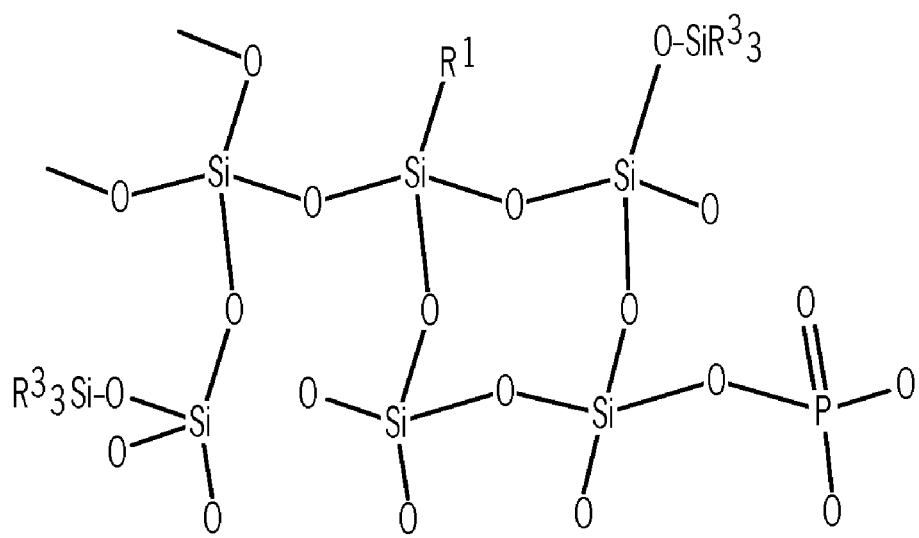
FIG. 10 is an illustration of a portion of a molecular structure of an end-capped phosphosiloxane carrier formed using the method of FIG. 4.
Figure 11:
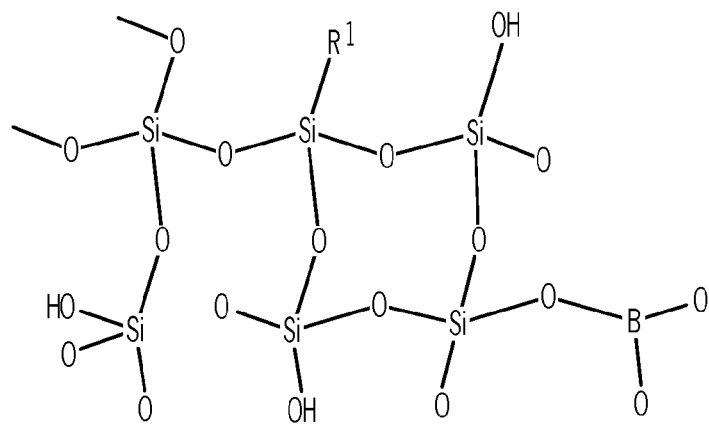
FIG. 11 is an illustration of a portion of a molecular structure of a borosiloxane carrier formed using the method of FIG. 4.
Figure 12:
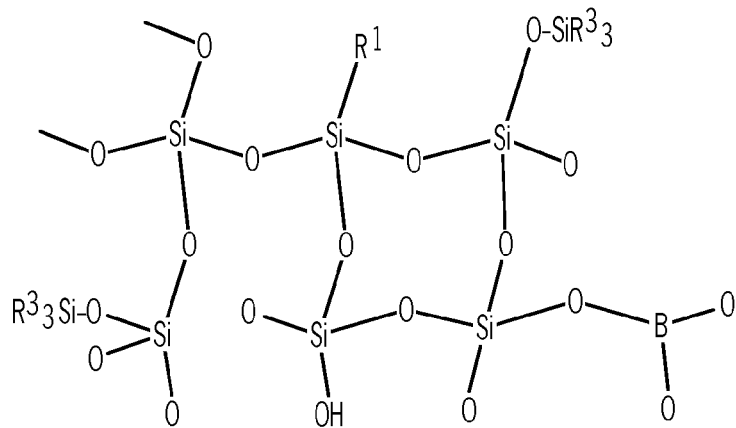
FIG. 12 is an illustration of a portion of a molecular structure of an end-capped borosiloxane carrier formed using the method of FIG. 4.

The method continues with the step of combining the silicate carrier and the dopant contributor, with or without having been previously combined with a solvent and/or functional additive, to form a dopant-silicate carrier (step 126). The dopant-silicate carrier has a silicon-oxygen backbone structure, such as one of those shown in FIGS. 5, 7, 9, and 11. FIG. 5 illustrates a portion of the molecular structure of an exemplary phosphorous-silicate carrier (a "phosphosilicate") formed as described above, FIG. 7 illustrates a portion of the molecular structure of an exemplary boron-silicate carrier (a "borosilicate") formed as described above, FIG. 9 illustrates a portion of the molecular structure of another exemplary phosphorous-silicate carrier (a "phosphosiloxane") formed as described above, where $R^1$ is hydrogen, an alkyl or an aryl group, and FIG. 11 illustrates a portion of the molecular structure of another exemplary boron-silicate carrier (a "borosiloxane") formed as described above, where $R^1$ is hydrogen, an alkyl or an aryl group. In an exemplary embodiment, solvent also is added to facilitate formation of the dopant-silicate carrier. Any of the above-described solvents may be used. In an optional embodiment, functional additives, such as any of the functional additives described above, also may be added (FIG. 4, step 128). The silicate carrier, the dopant source, any present solvents, and any present functional additives are mixed using any suitable mixing or stirring process that forms a homogeneous dopant-silicate carrier mixture, such as any of the mixing or stirring methods described above. Heat also may be used to facilitate formation of the dopant-silicate carrier of the dopant-silicate carrier mixture. In a preferred embodiment of the present invention, the dopant-silicate carrier is formed at a temperature in the range of about 15° C. to about 160° C. While the method 120 of FIG. 4 illustrates that the silicate carrier is provided first (step 122) and then the dopant contributor is added to the silicate carrier (step 124) to form the dopant-silicate carrier (step 126), it will be understood that components of the silicate carrier and the dopant contributor may be added together to form the dopant-silicate carrier, thus combining steps 122, 124, and 126.

In an alternative embodiment of the present invention, rather than forming a dopant-silicate carrier pursuant to steps 122, 124, and 126 described above, step 92 of method 90 (FIG. 3) includes the step of providing a commercially-available dopant-silicate carrier. Commercially-available dopant-silicate carriers include, but are not limited to, borosilicates such as Accuspin B-30, Accuspin B-40, and Accuspin B-60, and phosphosilicates such as Accuspin P-8545, Accuspin P-854 2:1, Accuglass P-TTY (P-112A, P-112 LS, and P-114A), and Accuglass P-5S, all available from Honeywell International. The dopant-silicate carrier can be combined with one or more solvents, such as any of the solvents described above with reference to step 122 of FIG. 4. In another exemplary embodiment of the invention, a spread-minimizing additive is added to the commercially-available dopant-silicate carrier. In a further, optional, embodiment, functional additives, such as any of the functional additives described previously, also may be added (FIG. 3, step 94).

Referring back to FIG. 3, in accordance with another exemplary embodiment, the dopant-silicate carrier is end-capped using a capping agent (step 96). End-capping replaces the unreacted condensable (cross-linkable) group (e.g., —H or —R, where R is a methyl, ethyl, acetyl, or other alkyl group) of the dopant-silicate carrier with a non-condensable (non-cross-linkable) alkylsilyl group or arylsilyl group (—$SiR^3_3$), where $R^3$ comprises one or more of the same or different alkyl and/or aryl groups, to become —$OSiR^3_3$, thus reducing or, preferably, preventing gelation of the dopant-silicate carrier. In this regard, clogging of printer nozzles and print heads due to gelation of the dopant-silicate carrier is minimized or eliminated. FIGS. 6, 8, 10, and 12 illustrate the dopant-silicate carriers of FIGS. 5, 7, 9, and 11, respectively, with end-capping. As noted above, the total carbon content of the resulting end-capped dopant-silicate carrier is in the range of about 0 to about 25 wt. %. The carbon content of the dopant-silicate carrier includes carbon components from end-capping group $R^3$ and from mid-chain group $R^1$. Suitable capping agents include acetoxytrimethylsilane, chlorotrimethylsilane, methoxytrimethylsilane, trimethylethoxysilane, triethylsilanol, triethylethoxysilane, and the like, and combinations thereof. The degree of end-capping is dependent on the doped-silicate carrier polymer size, the nozzle diameter, and the printing requirements. Preferably, the weight percent of the end-capping group of the end-capped dopant-silicate carrier is about 0 to about 10% of the dopant-silicate carrier. In a more preferred embodiment, the weight percent of the end-capping group of the end-capped dopant-silicate carrier is no greater than about 1% of the dopant-silicate carrier.

Next, in one exemplary embodiment, a moisture adsorption-minimizing component is added to the dopant-silicate carrier (step 98). The moisture adsorption-minimizing component is an organic material that is miscible with the dopant-silicate carrier and resists adsorption of water, although the moisture adsorption-minimizing component need not necessarily be hydrophobic. In addition, the moisture adsorption-minimizing component at least facilitates decreasing the pH of the resulting dopant-comprising composition, thus rendering it less corrosive and extending its shelf life. In one exemplary embodiment, the pH of the dopant-comprising composition has a pH in the range of from about 1 to about 6, preferably from about 1 to about 3. In another exemplary embodiment, the moisture adsorption-minimizing component is a salt of a hydrocarbon-containing non-metallic cation. Examples of such salts include, but are not limited to, tetrabutylammonium acetate (TBAA), tetramethylammonium acetate, tetraethylammonium nitrate, and combinations thereof. In yet another exemplary embodiment, the moisture adsorption-minimizing component is an organic silicon-containing material that is miscible with the dopant-silicate carrier. Examples include, but are not limited to, silanol-capped polydimethylsiloxane (PDMS), polydiethylsiloxane, polymethylphenylsiloxane, poly(alkylmethylsiloxane), such as poly(octylmethylsiloxane), dimethylsiloxane-ethylene oxide copolymer, and combinations thereof. The moisture adsorption-minimizing component may also be a combination of a salt of a hydrocarbon-containing non-metallic cation and an organic silicon-containing material that is miscible with the silicate carrier. In one exemplary embodiment, the moisture adsorption-minimizing component is present in an amount of from about 2 wt. % to about 25 wt. % of the dopant-comprising composition. While the method 90 of FIG. 3 illustrates that the moisture adsorption-minimizing component is added to the dopant-silicate carrier after it is formed and, optionally, end-capped, it will be understood that moisture adsorption-minimizing component can be added at any step during fabrication of the dopant-silicate carrier, that is, at steps 122, 124, and/or 126 (FIG. 4).

In another exemplary embodiment, in addition to or alternative to the addition of the moisture adsorption-minimizing component, a glycol ether, alcohol, ester, alkane, acid, or a combination thereof is added to the dopant-silicate carrier (step 100). The glycol ether, alcohol, ester, alkane, acid, or any combination thereof has a boiling point of at least about 150° C., preferably greater than about 150° C. (also referred to herein as "high boiling point material"). The high boiling point material causes the resulting dopant-comprising composition to form a conformal coating when jetted or otherwise printed onto a semiconductor substrate. Because the boiling point of the high boiling point material is high, not all the material vaporizes from the substrate before additional coatings are printed on the first coating, thus resulting in more uniform printing. In this regard, cracking of the coating is minimized. Examples of esters suitable for use in the dopant-comprising compositions contemplated herein include acetoacetate esters such as, for example, isopropylacetoacetate, and aliphatic esters such as, for example, ethyl decanoate, methyl dodecanoate, ethyl laurate, and butyl dodecanoate. Examples of alcohols include 1-decanol, 1-octanol, 1-docecanol, and isostearyl alcohol. Examples of glycol ethers include ethylene glycols, such as methyoxytriglycol, butoxytriglycol, ethylene glycol phenyl ether, butyl carbitol, and hexyl cellusolve, and propylene glycol such as tripropylene glycol n-butyl ether, tripropylene glycol methyl ether, propylene glycol n-butyl ether, propylene glycol methyl ether acetate and dipropylene glycol n-butyl ether. Tri(propylene glycol) butyl ether, such as Dowanol® TPnB, is available from The Dow Chemical Company of Midland, Mich. Other solvents include dodecane, isostearyl acids, ethylene glycol, and glycerol. In one exemplary, the high boiling point material is present in an amount of from about 1 wt. % to about 50 wt % of the dopant-comprising composition. While the method 90 of FIG. 3 illustrates that the high boiling point material is added to the dopant-silicate carrier after it is formed and, optionally, end-capped, it will be understood that high boiling point material can be added at any step during fabrication of the dopant-silicate carrier, that is, at steps 122, 124, and/or 126 (FIG. 4). The high boiling point material may also be added after formation of the dopant-silicate carrier but before addition of the moisture adsorption-minimizing component.

In accordance with yet another exemplary embodiment of the present invention, if the dopant-silicate carrier is present in excess solvent, the dopant-silicate carrier mixture is concentrated by at least partial evaporation of the solvent or solvent mixture (step 102). In this regard, the concentration and viscosity of the resulting dopant-comprising composition can be controlled and increased. In an exemplary embodiment of the invention, at least about 10% of the solvent(s) is evaporated. The solvent(s) may be evaporated using any suitable method such as, for example, permitting evaporation at or below room temperature, or heating the dopant-silicate carrier mixture to temperatures at or above the boiling points of the solvent(s). While FIG. 3 illustrates method 90 with the step of evaporating the solvent (step 102) performed after the step of end-capping the dopant-silicate carrier (step 96), and after the steps of adding the moisture adsorption-minimizing component and the high boiling point glycol ether and/or alcohol, it will be understood that step 102 can be performed before step 96, 98, or 100.

Figure 13:
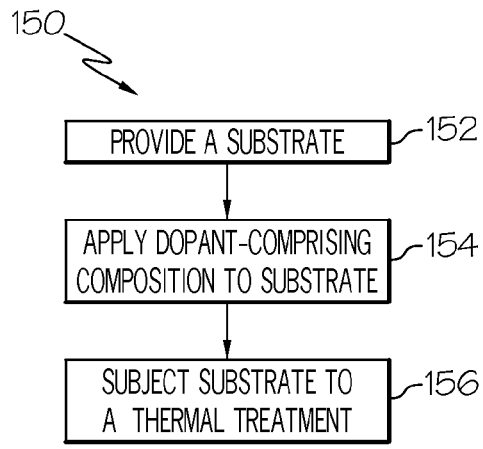
FIG. 13 is a flowchart of a method for forming doped regions in a semiconductor substrate using the dopant-comprising composition of FIG. 3, in accordance with an exemplary embodiment of the present invention.

Referring to FIG. 13, a method 150 for forming doped regions in a semiconductor substrate includes the step of providing a semiconductor substrate (step 152). As used herein, the term "semiconductor substrate" will be used to encompass monocrystalline silicon materials, including the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor substrate" encompasses other semiconductor materials such as relatively pure and impurity-doped germanium, gallium arsenide, and the like. In this regard, the method 150 can be used to fabricate a variety semiconductor devices including, but not limited to, microelectronics, solar cells, displays, RFID components, microelectromechanical systems (MEMS) devices, optical devices such as microlenses, medical devices, and the like.

Next, a dopant-comprising composition, such as the dopant-comprising composition prepared in accordance with method 90 of FIG. 3, is applied overlying the substrate (step 154). The dopant-comprising composition can be applied to the substrate using any of the non-contact printing processes or contact printing processes described above. In accordance with an exemplary embodiment of the present invention, the composition comprises the appropriate conductivity-determining type impurity dopant that is required for the doping. For example, for forming n-type doped regions, the composition includes a substance comprising phosphorous, arsenic, antimony, or combinations thereof. For forming p-type doped regions, the composition comprises a boron-containing substance. As used herein, the term "overlying" encompasses the terms "on" and "over". Accordingly, the composition can be applied directly onto the substrate or may be deposited over the substrate such that one or more other materials are interposed between the composition and the substrate. Examples of materials that may be interposed between the composition and the substrate are those materials that do not obstruct diffusion of the composition into the substrate during annealing. Such materials include phosphosilicate glass or borosilicate glass that forms on a silicon material during formation of P-well regions or N-well regions therein. Typically such silicate glass materials are removed by deglazing before dopants are deposited on the silicon material; however, in various embodiments, it may be preferable to omit the deglazing process, thereby permitting the silicate glass to remain on the substrate.

In an exemplary embodiment, the composition is applied to the substrate in a pattern that is stored in or otherwise supplied to a printer. An example of an inkjet printer suitable for use includes, but is not limited to, Dimatix Inkjet Printer Model DMP 2811 available from Fujifilm Dimatix, Inc. of Santa Clara, Calif. An example of an aerosol jet printer suitable for use includes, but is not limited to, an M3D Aerosol Jet Deposition System available from Optomec, Inc., of Albuquerque, N. Mex. Preferably, the composition is applied to the substrate at a temperature in the range of about 15° C. to about 80° C. in a humidity of about 20 to about 80%. Once the pattern of composition is formed on the substrate, the substrate is subjected to a high-temperature thermal treatment or "anneal" to cause the dopant of the composition to diffuse into the substrate, thus forming doped regions within the substrate in a predetermined or desired manner (step 156). The time duration and the temperature of the anneal is determined by such factors as the initial dopant concentration of the composition, the thickness of the composition deposit, the desired concentration of the resulting dopant region, and the depth to which the dopant is to diffuse. The anneal can be performed using any suitable heat-generating method, such as, for example, infrared heating, laser heating, microwave heating, and the like. In one exemplary embodiment of the present invention, the substrate is placed inside an oven wherein the temperature is ramped up to a temperature in the range of about 850° C. to about 1100° C. and the substrate is baked at this temperature for about 2 to about 90 minutes. Annealing also may be carried out in an in-line furnace to increase throughput. The annealing atmosphere may contain 0 to 100% oxygen in an oxygen/nitrogen or oxygen/argon mixture. In a preferred embodiment, the substrate is subjected to an anneal temperature of about 950° C. for about thirty (30) minutes in an oxygen ambient.

The following are examples of methods for manufacturing dopant-comprising compositions for use in fabricating doped regions of semiconductor substrates. The examples are provided for illustration purposes only and are not meant to limit the various embodiments of the present invention in any way.

EXAMPLE 1

In a vessel, 57.8 grams (g) of 1-butanol, 4 g 85% phosphoric acid, 25 g tetraethylorthosilicate (TEOS), 12.3 g acetic anhydride, and 0.9 g water were combined and refluxed for 1.5 hours. 10 g of this mixture was combined with 0.182 g of 70% nitric acid, the mixture was mixed well, and 1.9 g of 50% TBAA in ethanol was added. The solution was filtered using a 0.1 micron Teflon filter. The pH was measured using pH paper at about 2-3.

EXAMPLE 2

In a vessel, 50.25 g of 1-butonal, 4.9 g 85% phosphoric acid, 31 g TEOS, 12.3 g acetic anhydride, and 1.55 g water were combined and were refluxed for 1 hour and 15 minutes with stirring. 10 g of this mixture was combined with 0.46 g of 70% nitric acid, the mixture was mixed well, and 4.8 g of 50% TBAA in ethanol was added. The solution was filtered using a 0.1 micron Teflon filter. The pH was measured using pH paper at about 2-3.

EXAMPLE 3

In a vessel, 50.25 g of 1-butonal, 4.9 g 85% phosphoric acid, 31 g TEOS, 12.3 g acetic anhydride, and 1.55 g water were combined and were refluxed for 1 hour and 15 minutes with stirring. 100 g of this mixture was combined with 14 g of PDMS and the mixture was mixed for 15 minutes at room temperature. The composition stood at room temperature for 18 hours and subsequently was stored in a freezer at −20° C. The composition then was filtered using a 0.1 micron Teflon filter.

EXAMPLE 4

In a vessel, 69.08 g of 1-butonal, 2.4 g 85% phosphoric acid, 15.3 g TEOS, 12.3 g acetic anhydride, and 0.92 g water were combined and were refluxed for 3 hours with stirring. (Solution A)

A Fujifilm Inkjet Printer Model 2811 was used for printing Solution A onto a 5-inch (127-mm) solar wafer. A dispense volume of 10 picoliters (pL) was used with the inkjet printer stage temperature and the nozzle temperature set at room temperature and a jetting frequency set at 2 kilohertz (kHz).

The bottom tip of the nozzle was approximately 1 millimeter (mm) from the wafer. An area of 3 centimeters (cm) by 3 cm was printed using drop spacing of 25 microns. After printing, the wafer was baked at 200° C. for 2 minutes and then heated to 1000° C. for 30 minutes in 2.5% oxygen/97.5% nitrogen atmosphere. An optical microscopic picture at 500 magnification was taken and the Solution A film showed dot defects.

In a vessel, 69.08 g of isopropyl alcohol, 2.4 g 85% phosphoric acid, 15.3 g TEOS, 12.3 g acetic anhydride, and 0.92 g water were combined and were refluxed for 3 hours with stirring. 5.03 g of this mixture was combined with 0.45 g of 50% TBAA in ethanol and the mixture was mixed well. (Solution B)

Inkjet printing of Solution B was performed under the same conditions as described for Solution A. A post-bake optical microscopic picture at 500 magnification was taken and the Solution B film illustrated a smooth surface without dot defects.

EXAMPLE 6

100 g of B30 borosilicate, available from Honeywell International, was concentrated by rotary evaporation to obtain 25 g concentrate. The concentrate was diluted with 25 g ethanol to produce Solution C.

Solution C was spin coated onto a 4-inch (102-mm) semiconductor wafer at a spin speed of 3000 revolutions per minute (rpm). After baking at 200° C. for 2 minutes, an optical microscopic picture at 200 magnification was taken and the Solution C film showed dot defects. The baked film was also hazy.

0.4 g of solid TBAA was added to 10 g Solution C to produce Solution D.

Solution D was spin coated onto a 4-inch (102-mm) semiconductor wafer at a spin speed of 800 rpm. After baking at 200° C. for 2 minutes, an optical microscopic picture at 200 magnification was taken and the Solution D film was shiny with no dot defects.

EXAMPLE 7

Solution E was prepared by mixing 50.85 g 1-butanol, 4.3 g 85% phosphoric acid, 31 g TEOS, 12.3 g acetic anhydride, and 1.55 g water in a flask. The total weight of the solution was 100 g. The mixture was heated to reflux and was refluxed for 1 hour and 15 minutes with stirring.

14.0 g of silanol-capped polydimethylsiloxane was added to 100 g of Solution E. The total weight was 114 g. After mixing for 15 minutes, the solution was left at room temperature for 18 hours. (Solution E1)

Solution E2 was prepared by adding 12.6 g of Dowanol® TPnB to the 114 g of Solution E1. The total weight of Solution E2 was 126.6 g. Solution E2 was mixed well at room temperature.

Solution E2 was filled into the jetting printhead of a Fujifilm Inkjet Printer Model 2811 and was tested for jettability after 4, 8, and 10 minutes of stoppage time. Jetting was performed using 15 nozzles with a 21 micron nozzle diameter and 7 KHz jetting frequency. After jetting was stopped for a period of time, the jetting was resumed and the number of unjetted nozzles, either due to clogging or flooding, was recorded. The Solution E2 passed the latency test after 10 minutes with all 15 nozzles still jetting well.

Solutions E1 and E2 were inkjetted onto textured solar cell wafers using a drop spacing of 35μm, two printing passes, a jetting frequency of 5 KHz, and stage and nozzle temperatures at room temperature. A 5 cm×5 cm square was printed. After printing, the printed wafer was baked at 200° C. for 2 minutes, followed by a cure at 950° C. for 30 minutes while the wafers were pushed into a pre-heated furnace temperature of 650° C. and heated to 950° C. at a heating rate of 5° C. per minute in flowing nitrogen. The cured wafers were examined for any cracks under optical microscope at up to 1000 magnification. The post-cured square printed from Solution E1 was observed to have cracks while the post-cured square printed from Solution E2 did not exhibit any cracks.

Accordingly, conductivity-determining type impurity dopant-comprising compositions that resist moisture and/or form conformal precursor coatings on semiconductor substrates have been provided. In one exemplary embodiment, the compositions contemplated herein comprise a moisture adsorption-minimizing component that causes the composition to resist moisture absorption. In this regard, in addition to decreasing moisture adsorption, the moisture-adsorption-minimizing component slightly increases the pH of the composition, making the composition less corrosive and extending its shelf-life. Alternatively, or in addition, the compositions contemplated herein comprise a glycol ether, an alcohol, or both that causes the composition to form a conformal precursor coating, that is, a precursor coating having a substantially uniform thickness across the surface of a semiconductor substrate upon which the coating lies. A conformal coating is less susceptible to cracking than a non-conformal coating and is thus more conducive to desired dopant profiles after heat treatment. In this regard, the glycol ether and/or the alcohol has a boiling point of at least 150° C. Methods for fabricating such compositions and methods for forming doped regions in semiconductor substrates using such compositions have also been provided.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A dopant-comprising composition comprising:
a conductivity-determining type impurity dopant;
a silicate carrier;
a solvent; and
a moisture adsorption-minimizing component.

2. The dopant-comprising composition of claim 1, wherein the dopant-comprising composition has a pH in a range of from about 1 to about 6.

3. The dopant-comprising composition of claim 1, wherein the moisture adsorption-minimizing component comprises a salt of a hydrocarbon-containing non-metallic cation.

4. The dopant-comprising composition of claim 3, wherein the moisture adsorption-minimizing component comprises a material selected from the group consisting of tetrabutylammonium acetate (TBAA), tetramethylammonium acetate, tetraethylammonium nitrate, and combinations thereof.

5. The dopant-comprising composition of claim 1, wherein the moisture adsorption-minimizing component comprises an organic silicon-containing material that is miscible with the silicate carrier.

6. The dopant-comprising composition of claim 1, wherein the moisture adsorption-minimizing component comprises a material selected from the group consisting of silanol-capped polydimethylsiloxane (PDMS), polydiethylsiloxane, polymethylphenylsiloxane, poly(alkylmethylsiloxane), dimethylsiloxane, and combinations thereof.

7. A method for forming a doped region in a semiconductor substrate, the method comprising the steps of:
applying a dopant-comprising composition to a region of the semiconductor substrate, wherein the dopant-comprising composition comprises:
a conductivity-determining type impurity dopant;
a silicate carrier;
a solvent; and
a moisture adsorption-minimizing component; and
subjecting the semiconductor substrate to a thermal treatment such that the conductivity-determining type impurity dopant diffuses into the semiconductor substrate.

8. The method of claim 7, wherein the step of applying comprises applying the dopant-comprising composition having a pH in a range of from about 1 to about 6.

9. The method of claim 7, wherein the step of applying comprises applying the dopant-comprising composition with the moisture adsorption-minimizing component comprising a salt of a hydrocarbon-containing non-metallic cation.

10. The method of claim 9, wherein the step of applying comprises applying the dopant-comprising composition with the moisture adsorption-minimizing component comprising a material selected from the group consisting of tetrabutylammonium acetate (TBAA), tetramethylammonium acetate, tetraethylammonium nitrate, and combinations thereof.

11. The method of claim 7, wherein the step of applying comprises applying the dopant-comprising composition with the moisture adsorption-minimizing component comprising an organic silicon-containing material that is miscible with the silicate carrier.

12. The method of claim 11, wherein the step of applying comprises applying the dopant-comprising composition with the moisture adsorption-minimizing component comprising a material selected from the group consisting of silanol-capped polydimethylsiloxane (PDMS), polydiethylsiloxane, polymethylphenylsiloxane, poly(alkylmethylsiloxane), dimethylsiloxane, and combinations thereof.

13. A method for forming a dopant-comprising composition comprising the steps of:
combining a dopant contributor with a silicate carrier to form a dopant-silicate carrier; and
adding a moisture adsorption-minimizing component to the silicate carrier, the dopant-silicate carrier, or both.

14. The method of claim 13, wherein the step of adding comprises adding a salt of a hydrocarbon-containing non-metallic cation.

15. The method of claim 13, wherein the step of adding comprises adding an organic silicon-containing material that is miscible with the silicate carrier.

* * * * *